United States Patent [19]
Dieterich

[11] Patent Number: 4,803,647
[45] Date of Patent: Feb. 7, 1989

[54] SAMPLED DATA AUDIO TONE CONTROL APPARATUS

[75] Inventor: Charles B. Dieterich, Kingston, N.J.

[73] Assignee: RCA Licensing Corporation, Princeton, N.J.

[21] Appl. No.: 868,669

[22] Filed: May 30, 1986

[51] Int. Cl.[4] ........................................... G06F 15/31
[52] U.S. Cl. ............................................... 364/724.17
[58] Field of Search ........................................ 364/724

[56] References Cited

U.S. PATENT DOCUMENTS

| | | | |
|---|---|---|---|
| 3,665,171 | 5/1972 | Morrow | 364/724 |
| 3,706,076 | 12/1972 | Schuster | 364/724 |
| 4,322,810 | 3/1982 | Wakayama | 364/724 |
| 4,356,559 | 10/1982 | Candy et al. | 364/724 |
| 4,422,156 | 12/1983 | Sano | 364/724 |
| 4,467,440 | 8/1984 | Sano et al. | 364/724 |
| 4,507,725 | 3/1985 | Christopher et al. | 364/724 |
| 4,524,422 | 6/1985 | Kasuga | 364/724 |
| 4,606,009 | 8/1986 | Wiesmann | 364/724 |
| 4,644,488 | 2/1987 | Nathan | 364/724 |
| 4,653,016 | 3/1987 | Muellar | 364/724 |

OTHER PUBLICATIONS

Yoshimutsu Hirata, "Simple Digital Filters for Sound Reproduction", Wireless World, Sep. 1982, pp. 77–79.
Excerpts from Chp. 6, Programs for Digital Signal Processing, IEEE Press, 1979, New York.
D. Self, Precision Preamplifier, Wireless World, Oct. 1983, pp. 31–34.
Yoshio Ishigaki et al., "Monolithic Filter and its Application to TU MPX Sound Decoder IC", IEEE Trans. CE, vol. CE-29, No. 4, Nov. 1983, pp. 475–485.
J. T. R. Sylvester Bradley, "Digital Filter Design Procedure", Wireless World, Jul. 1983, pp. 42–44.
J. T. R. Sylvester Bradley, "Digital Filter Design Procedure", Wireless World, May 1983, pp. 76–78.
J. L. Linsley Hood, "Modular Preamplifier", Wireless World, Nov. 1982, pp. 60–64.
Oppenheim and Schafer, *Digital Signal Processing*, 1975, Englewood Cliffs, N.J., Prentice Hall, pp. 136–161.

*Primary Examiner*—Gary V. Harkcom
*Assistant Examiner*—Dale M. Shaw
*Attorney, Agent, or Firm*—Eugene M. Whitacre; Paul J. Rasmussen; Eric P. Herrmann

[57] ABSTRACT

A sampled data tone control circuit is implemented using a two pole canonic recursive/non-recursive filter. The filter is programmed with predetermined sets of sample weighting coefficients to selectively cut or boost either the base or treble band of frequencies.

3 Claims, 2 Drawing Sheets

SAMPLED DATA AUDIO TONE CONTROL APPARATUS

This invention relates to audio tone control for sampled data systems.

BACKGROUND OF THE INVENTION

Tone control in general is the selective amplification or attenuation of particular frequency bands of an audio signal. Typically tone control systems divide the audio spectrum into a bass or low frequency band, a mid-band, and a treble or high frequency band. In tone control the bass and treble bands are independently amplified or attenuated while the amplitude response of the mid-band is maintained unaltered.

Yoshimutsu Hirata in the article "Simple Digital Filters For Sound Reproduction", Wireless World, Sept. 1982, pp. 77-79 (incorporated herein by reference) describes a sampled data tone control system realized by the cascade connection of two sampled data filters. One of these filters controls the bass response and includes the cascade combination of a recursive and a non-recursive sampled data filter having the frequency response $H_1(Z)$ given by $$H_1(Z) = 1 - AZ^{-1}/(1 - BZ^{-1}) \quad (1)$$

where Z is the conventional Z-transform variable and A and B are variable coefficients.

The other of the two filters controls the treble response and also includes the cascade connection of a recursive and a non-recursive sampled data filter. The frequency response $H_2(Z)$ of this filter is described by $$H_2(Z) = (1 - H)/(1 - G) \cdot (1 - GZ^{-1})/(1 - HZ^{-1}) \quad (2)$$

where H and G are variable coefficients. The combined response T(Z) which is the response of the tone control apparatus is $$T(Z) = (1 - AZ^{-1})/(1 - BZ^{-1}) \cdot (1 - GZ^{-1})/(1 - HZ^{-1}) \cdot (1 - H)/(1 - G). \quad (3)$$

Equation (3) indicates that a minimum of six scaling circuits are required to perform the tone control transfer function. If the audio signals are in digital format and defined by 16-bit samples, it will readily be appreciated by those skilled in the art of digital signal processing that the scaling circuits (e.g. multipliers) represent a substantial amount of hardware.

It is an object of the present invention to provide tone control for sampled data signals with a minimum of hardware. To this end the present inventor expanded equation (3) resulting in the expression $$T(Z) = (1 - H)[1 - (A + G)Z^{-1} + AGZ^{-2}]/(1 - G)[1 - (B + H)Z^{-1} + BHZ^{-2}] \quad (4)$$

which is of the form $$T(Z) = G_0 \cdot (1 + b_1 Z^{-1} + b_2 Z^{-2})/(1 - a_1 Z^{-1} - a_2 Z^{-2}) \quad (5)$$

where $G_0 = (1 - H)/(1 - G)$, $b_1 = -(A + G)$, $b_2 = AG$, $a_1 = (B + H)$ and $a_2 = -BH$. Equation (5) describes a general filter function which may be realized with a minimum parts or canonic form. While there appears to be a direct correspondence between equation (3) and equation (5) this is only a mathematical artifice. The cascade arrangement of filter functions represented by equation (3) permits simultaneous independent adjustment of both the bass and treble response. In general this is not practical with a canonic filter represented by the transfer function of equation (5). However, with appropriate selection of coefficients the canonic filter may be conditioned to provide a low-pass response or a high-pass response or a notch type response. Thus, according to the invention the canonic filter form may be arranged with selectable coefficients to boost or attenuate bass response or alternatively to boost or attenuate treble response. A third alternative, by selecting coefficients to produce a notch filter type response, is to simultaneously boost or attenuate both the bass and treble response.

SUMMARY OF THE INVENTION

The present invention is a tone control circuit for processing sampled data signals which includes the integral combination of a second order non-recursive filter and a second order recursive filter. The recursive and non-recursive filters are programmable by the application of predetermined coefficients to evoke particular alternative frequency response characteristics. A user-controlled coefficient generating apparatus is coupled to the filter to selectively condition the filter circuitry to produce predetermined bass and treble frequency responses.

DETAILED DESCRIPTION OF THE INVENTION

The invention is a sampled data processing circuit which may be implemented in either analog or digital form with the appropriate selection of circuit elements. For illustrative purposes the invention will be described in terms of digital signal processing hardware. The audio signal to be processed is assumed to be in pulse code modulated (PCM) format, for example, two's complement binary samples. The description of the apparatus of FIGS. 2 and 3 will be described in general functional terms that are applicable to both serial-bit and parallel-bit applications.

Figure 1:
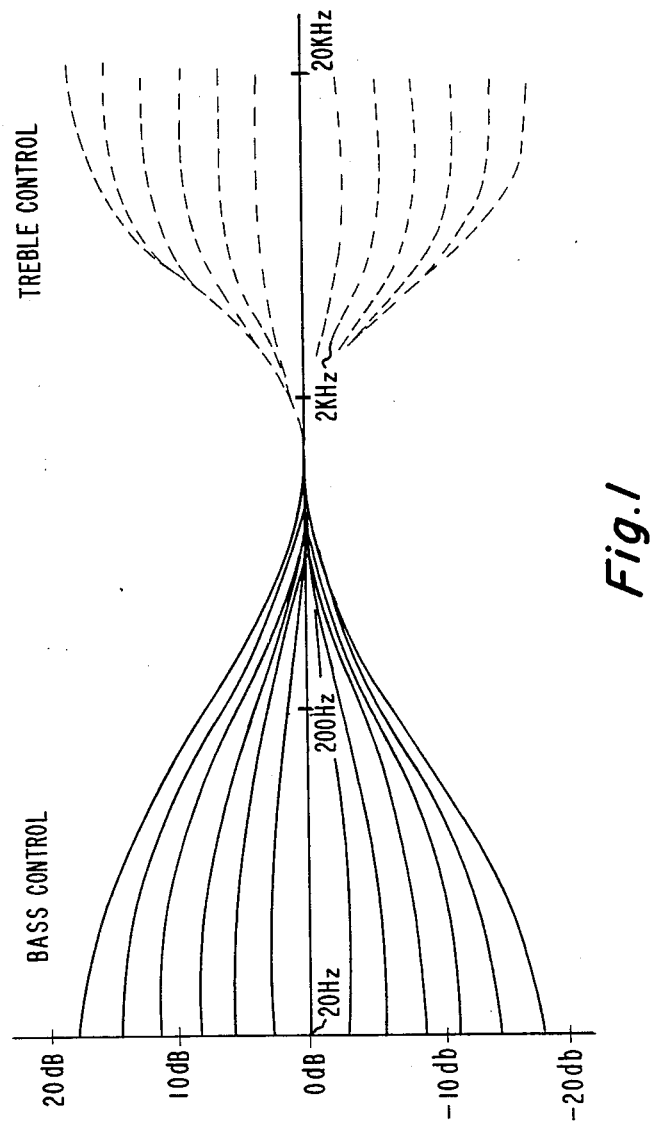
FIG. 1 is a graph of the frequency versus amplitude response of audio tone control apparatus.
Figure 2:
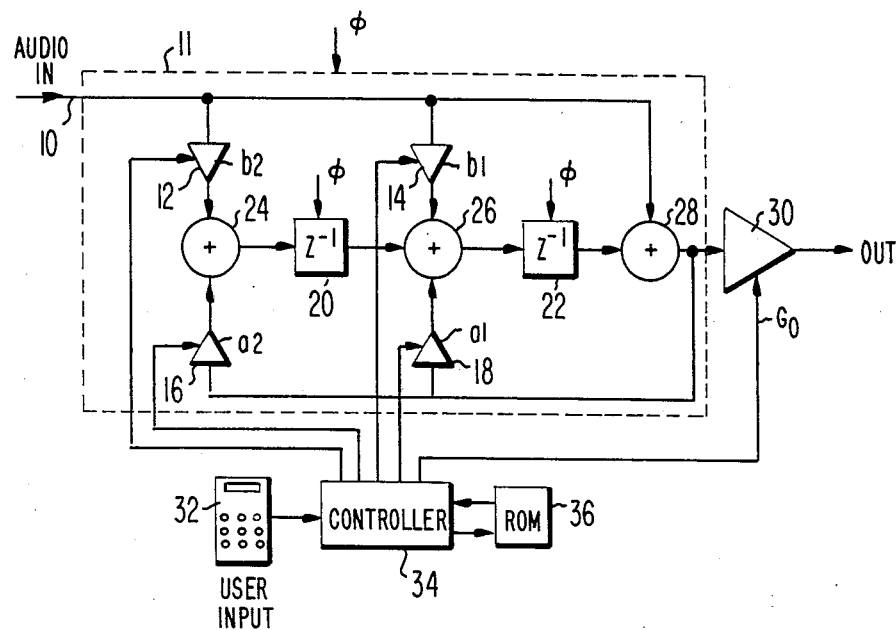
FIGS. 2 and 3 are block diagrams of alternate embodiments of sampled data tone control apparatus embodying the present invention.
Figure 3:
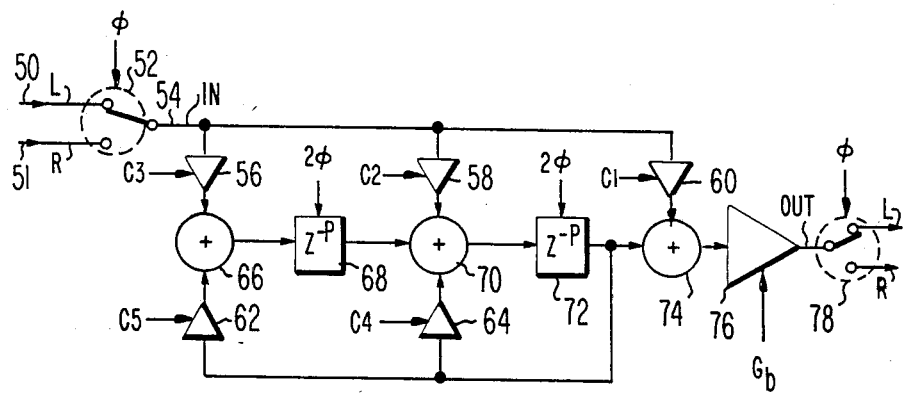

FIG. 1 shows a particular set of response curves for the tone control circuit illustrated in FIGS. 2 and 3. The curves for frequencies less than 2 KHz correspond to typical controllable bass responses. The curves for frequencies greater than 2 KHz correspond to typical controllable treble responses. For the example illustrated in FIG. 1, the bass response has been designed to roll off at 6 dB per octave (single pole) while the treble response changes at 12 dB per octave (double pole response). The mid-band frequency response is maintained relatively constant at unity gain.

Referring to FIG. 2, a first embodiment of a digital audio tone control circuit is illustrated. The audio signal to be processed is presumed to be in the form of PCM samples occurring at a sample rate $f_s$. The tone control circuitry is controlled by a clock signal $\Phi$, synchronous with the sample rate $f_s$, for sequencing the audio samples through the circuitry. In the figure, the circuitry circumscribed by the broken line is the canonic form of a filter having the general transfer function $H_c(Z)$ given by the equation $$H_c(Z)=(1+b_1Z^{-1}+b_2Z^{-2})/(1-a_1Z^{-1}-a_2Z^{-2}). \quad (6)$$

Coupling a scaling element 30, having a gain factor functionally dependent upon the coefficients $a_i$ and $b_i$, to the canonic filter, and judiciously selecting the values of the coefficients results in circuitry suitable for tone control. A particular set of coefficients $a_i$ and $b_i$ is required to produce each one of the response curves illustrated in FIG. 1.

The sets of coefficients may be stored in a look-up table such as a read-only-memory (ROM) 36. A given set of coefficients is accessed from the ROM 36 by a controller 34 under user control 32, and applied to the filter apparatus 11. The controller 34 may be a microprocessor and the user control 32 may be function keys or switches on the audio unit. When the user presses a key indicating that the bass response, for example, should be amplified or attenuated, the controller will select a set of coefficients which will increase/decrease the bass response by one step in the available responses. If the altered response is not satisfactory the keys may be repeatedly engaged and various sets of coefficients selected until the desired tonal response is achieved.

The input samples on connection 10 are coupled to the weighting elements 12 and 14 which weight the input samples by the coefficients $b_2$ and $b_1$ respectively. The weighted input samples from weighting elements 12 and 14 and the input samples on input connection 10 are respectively coupled to first input terminals of adders or sample combining elements 24, 26 and 28. Output samples from adder 28 are coupled to weighting elements 16 and 18 where they are weighted by the coefficients $a_2$ and $a_1$. The weighted samples from weighting elements 16 and 18 are coupled to respective second input terminals of adders 24 and 26. The output terminal of adder 24 is coupled to a third input terminal of adder 26 via a one sample period delay element 20 and the output terminal of adder 26 is coupled to the second input terminal of adder 28 via a one sample period delay element 22. The output terminal of adder 28 is coupled to the input terminal of the scaling element 30 which provides the output signal OUT of the tone control circuit. Gain control coefficients, $G_0$, are coupled to scaling element 30 from controller 34.

The coefficients $a_i$ and $b_i$ are determined from the following relationships.

For a set of complex poles or zeroes $$b_1 = -2r_{z2} \cos(\theta_z) \quad (7)$$

$$b_2 = r_z \quad (8)$$

$$a_1 = 2r_{p2} \cos(\theta_p) \quad (9)$$

$$a_2 = -r_p \quad (10)$$

where $r_z$ and $r_p$ are the radial coordinates of the desired zeroes and poles in the Z-plane respectively and $\theta_z$ and $\theta_p$ are the angular ooordinates of the zeroes and poles in the z-plane respectively.

For a set of real axis singularities $$b_1 = -r_{z1} - r_{z2} \quad (11)$$

$$b_2 = r_{z1} r_{z2} \quad (12)$$

$$a_1 = r_{p1} + r_{p2} \quad (13)$$

$$a_2 = -r_{p1} r_{p2}. \quad (14)$$

Equations (7)-(14) apply for any range and sign of the parameters. It is not necessary that the singularities be the same type, that is $b_1$ and $b_2$ may be determined for a complex zero and $a_1$ and $a_2$ determined for two real poles etc. The values for $r_z$, $r_p$, $\theta_z$ and $\theta_p$ are determined by synthesizing the desired response in the frequency domain (S-plane) and mapping the singularities from the S-plane to the Z-plane using the bilinear transform $Z=(1+S)/(1-S)$, here S is meant to represent the conventional Laplace Transform Variable. The scale factor $G_0$ is selected to make the out of band frequency response substantially flat at 0 db. That is, for the treble response the coefficient $G_O$ is selected to provide an overall gain of substantially 1 at zero Hertz. Thus, for the treble response $G_0$ is substantially equal to $(1-a_1-a_2)/(1+b_1+b_2)$. Note, however, that the closest binary multiple thereto may be selected to facilitate binary multiplication. Similarly for the bass response $G_0$ is selected to provide an overall gain of substantially 1 in the treble frequency range. Computer programs for calculating the coefficients of equation (6) from the desired frequency response may be found in chapter 6 of *Programs For Digital Signal Processing* edited by the Digital Signal Processing Committee of the IEEE Acoustics, Speech and Signal Processing Society, IEEE Press, 1979.

The family of curves defining the bass response illustrated in FIG. 1 were generated using single poles and zeroes. That is, the variable coefficients G and H in equations (2) and (4) are zero which constrains $G_0$ in equation (5) to equal 1 and $a_2$ and $b_2$ to equal zero. The exemplary bass response, selected singularity and coefficients used to generate the family of curves are tabulated in Table I.

TABLE I

| Setting db | Pole radius | Pole angle | zero radius | zero angle | $G_0$ | a1 | a2 | b1 | b2 |
|---|---|---|---|---|---|---|---|---|---|
| +18 | 0.99554 | 0.0 | 0.96121 | 0.0 | 1.000 | 0.99554 | 0.00000 | −0.96121 | 0.00000 |
| +15 | 0.99400 | 0.0 | 0.96450 | 0.0 | 1.000 | 0.99400 | 0.00000 | −0.96450 | 0.00000 |
| +12 | 0.99217 | 0.0 | 0.96787 | 0.0 | 1.000 | 0.99217 | 0.00000 | −0.96787 | 0.00000 |
| +9 | 0.99000 | 0.0 | 0.97132 | 0.0 | 1.000 | 0.99000 | 0.00000 | −0.97132 | 0.00000 |
| +6 | 0.98749 | 0.0 | 0.97480 | 0.0 | 1.000 | 0.98749 | 0.00000 | −0.97480 | 0.00000 |
| +3 | 0.98465 | 0.0 | 0.97823 | 0.0 | 1.000 | 0.98465 | 0.00000 | −0.97823 | 0.00000 |
| flat | 0.00000 | 0.0 | 0.00000 | 0.0 | 1.000 | 0.00000 | 0.00000 | 0.00000 | 0.00000 |
| −3 | 0.97823 | 0.0 | 0.98465 | 0.0 | 1.000 | 0.97823 | 0.00000 | −0.98465 | 0.00000 |
| −6 | 0.97480 | 0.0 | 0.98749 | 0.0 | 1.000 | 0.97480 | 0.00000 | −0.98749 | 0.00000 |
| −9 | 0.97132 | 0.0 | 0.99000 | 0.0 | 1.000 | 0.97132 | 0.00000 | −0.99000 | 0.00000 |
| −12 | 0.96787 | 0.0 | 0.99217 | 0.0 | 1.000 | 0.96787 | 0.00000 | −0.99217 | 0.00000 |
| −15 | 0.96450 | 0.0 | 0.99400 | 0.0 | 1.000 | 0.96450 | 0.00000 | −0.99400 | 0.00000 |

TABLE I-continued

| Setting db | BASS CONTROL: | | | | | | | | |
|---|---|---|---|---|---|---|---|---|---|
| | Pole | | zero | | | | | | |
| | radius | angle | radius | angle | $G_0$ | a1 | a2 | b1 | b2 |
| −18 | 0.96121 | 0.0 | 0.99554 | 0.0 | 1.000 | 0.96121 | 0.00000 | −0.99554 | 0.00000 |

When the canonic filter 11 and scaling circuit 30 are programmed with the coefficients tabulated in Table I the response in the treble band of frequencies is substantially flat at 0 dB. The illustrated coefficients in Table I were generated assuming a sample rate of four times the horizontal frequency of an NTSC television signal or 62.5 kHz to accommodate digitally processing a BTSC stereo TV sound signal.

The family of responses defining the treble response illustrated in FIG. 1 were generated by selecting complex pairs of zeroes and poles. The maximum treble response, selected singularities and coefficients used to generate the family of treble curves are tabulated in Table II.

TABLE II

| Setting db | TREBLE CONTROL: | | | | | | | | |
|---|---|---|---|---|---|---|---|---|---|
| | Pole | | zero | | | | | | |
| | radius | angle | radius | angle | $G_0$ | a1 | a2 | b1 | b2 |
| +18 | 0.62010 | 29.8 | 0.83820 | 10.2 | 5.820 | 1.07620 | −0.38452 | −1.64991 | 0.70258 |
| +15 | 0.66520 | 24.8 | 0.83820 | 10.2 | 4.460 | 1.20771 | −0.44249 | −1.64991 | 0.70258 |
| +12 | 0.70740 | 20.7 | 0.83820 | 10.2 | 3.360 | 1.32347 | −0.50041 | −1.64991 | 0.70258 |
| +9 | 0.74590 | 17.3 | 0.83820 | 10.2 | 2.510 | 1.42431 | −0.55637 | −1.64991 | 0.70258 |
| +6 | 0.78060 | 14.5 | 0.83820 | 10.2 | 1.890 | 1.51147 | −0.60934 | −1.64991 | 0.70258 |
| +3 | 0.81130 | 12.2 | 0.83820 | 10.2 | 1.370 | 1.58596 | −0.65821 | −1.64991 | 0.70258 |
| flat | 0.00000 | 0.0 | 0.00000 | 0.0 | 1.000 | 0.00000 | 0.00000 | 0.00000 | 0.00000 |
| −3 | 0.83820 | 10.2 | 0.81130 | 12.2 | 0.730 | 1.64991 | −0.70258 | −1.58596 | 0.65821 |
| −6 | 0.83820 | 10.2 | 0.78060 | 14.5 | 0.529 | 1.64991 | −0.70258 | −1.51147 | 0.60934 |
| −9 | 0.83820 | 10.2 | 0.74590 | 17.3 | 0.398 | 1.64991 | −0.70258 | −1.42431 | 0.55637 |
| −12 | 0.83820 | 10.2 | 0.70740 | 20.7 | 0.298 | 1.64991 | −0.70258 | −1.32347 | 0.50041 |
| −15 | 0.83820 | 10.2 | 0.66520 | 24.8 | 0.224 | 1.64991 | −0.70258 | −1.20771 | 0.44249 |
| −18 | 0.83820 | 10.2 | 0.62010 | 29.8 | 0.172 | 1.64991 | −0.70258 | −1.07620 | 0.38452 |

When the coefficients tabulated in Table II are applied to the canonic filter 11 and scaling circuit 30, the system response in the bass band of frequencies is substantially flat at 0 db.

Recursive or feedback circuit arrangements such as the one illustrated in FIG. 2 have an inherent shortcoming. That shortcoming is that the internal sample sums accumulated in the adders may become large enough to exceed their bit capacity. When this occurs the system tends to oscillate through limit cycles. This condition may be forestalled by including circuitry to detect internal overflow conditions and limiting one or more of the internal sums, or alternatively by providing the processing elements with sufficient overhead bit capacity to handle the largest expected signal conditions. Neither of these solutions is satisfactory for a reduced hardware system.

The circuitry of FIG. 3 includes a third solution to the overflow problem. FIG. 3 illustrates a tone control circuit including integral recursive and non-recursive filter elements and which provides a transfer function substantially the same as the transfer function of the FIG. 2 circuitry. The primary differences between the FIG. 2 and FIG. 3 circuits are that (a) the feedback signal is taken ahead of the output adder (74) so that the signal fed back tends to be smaller and (b) the input signal applied to the adders is attenuated by weighting coefficients all of which are constrained to substantially fall within the range from positive 1 to negative 1. In addition, the weighting coefficients applied in the recursive or feedback paths are constrained to substantially fall within the range from positive 2 to negative 2. With this arrangement the internal sums are constrained to smaller maximum values. The only additional hardware over the FIG. 2 arrangement is one weighting element (60).

The FIG. 3 embodiment is drawn with multiplexing switches 52 and 78 so that two signals, for example the left, L, and right, R, audio signals, may be concurrently processed. For multiplexed operation the delay elements 68 and 72 each provide two sample delays, i.e. the exponent p in the figure equals 2. For non-multiplexed operation switches 52 and 78 are eliminated and the delay elements 68 and 72 each provide one sample delay, i.e. the exponent p equals 1.

The left and right audio samples applied to input connections 50 and 51 are alternately coupled to connection 54 by multiplexing switch 52. which is controlled by the sample rate clock Φ. The left audio samples are coupled to connection 54 for the first half of each sample period and the right audio samples are coupled to connection 54 for the latter half of each sample period. The input samples are coupled to the weighting elements 56–60 wherein they are weighted by the coefficients C3, C2 and C1. respectively. The weighted input samples are coupled to first input terminals of the adders 66, 70 and 74. The output of adder 66 is coupled to a second input terminal of adder 70 via delay element 68 and the output terminal of adder 70 is coupled to a second input terminal of adder 74 via delay element 72. The output terminal of delay element 72 is also coupled to the weighting elements 62 and 64 wherein they are weighted by the coefficients C5 and C4 respectively. The output terminals of weighting elements 62 and 64 are coupled to respective input terminal of adders 66 and 70. Delay elements 68 and 72 are clocked at twice the sample rate. Since each of the delay elements include two delay stages, during the first half of each sample period the respective delay elements output delayed sample sums having contributions from only the left audio signal and internally store delayed sample sums having contributions from only the right audio signal. During the latter half of each sample period the respective delay elements output delayed sample sums having contributions from only the right audio signal and internally store delayed sample sums from only the left audio signal. Thus, during any time period the adders 66, 70 and 74 have input samples applied exclusively from one of the left or right audio signals.

The output terminal of adder 74 is coupled to the input terminal of a scaler/multiplier 76 which scales the sample sums by the factor $G_b$ and applies the scaled samples to multiplexer 78. Multiplexer 78 under the control of the sample rate clock $\phi$ separates the interleaved processed left and right audio signals and applies them to a left channel connection L and a right channel connection R.

The coefficients $C_i$ and the gain factor $G_b$ are determined as follows. The factors $a_i$, $b_i$ and G requisite to produce the desired tone responses in a FIG. 2 type circuit are calculated. For a given set of coefficients $a_i$ and $b_i$, the sums of (a1+b1) and (a2+b2) are calculated. If either of these sums has an absolute value which is greater than or equal to one, for a particular set of coefficients, a scale factor $G_n$ is selected, which, when multiplied by the larger sum $(a_i+b_i)$, will produce a product $G_n \cdot (a_i+b_i)$ which is less than one e.g. .9955. Nominally, the scale factor $G_n$ will be selected to conveniently perform binary multiplication. The coefficient C1 is set equal to the scale factor $G_n$. The coefficients C2 and C3 are set equal to the products $G_n \cdot (b1+a1)$ and $G_n \cdot (b2+a2)$ respectively. The scale factor $G_b$ which is applied to the scaler/multiplier 76 is set equal to the quotient of the scale factor $G_0$ divided by $G_n$. The coefficient C4 is set equal to a1 and the scale factor C5 is set equal to a2. The FIG. 3 apparatus implemented with the coefficients $C_i$ and $G_b$ as determined above, will have the same transfer function as the FIG. 2 apparatus implemented with coefficients $a_i$, $b_i$ and $G_0$.

Since binary multiplication by integer powers of two is easily effected by bit shifting in parallel-bit systems or bit-time advances/delays in serial-bit systems, it is convenient to select the scale factor $G_b'$ as an integral power, b, of two ($2^b$). $G_b$ may be represented by $(b')(g_b)$ where $G_b'=2^b$ and $g_b=G_b/G_b'$. Therefore, if one chooses to use $G_b'$ for the gain factor applied to scaler/multiplier 76 then the value $G_n'$ is used in determining coefficients C1, C2 and C3 where $G_n'=G_n g_b$.

Table III illustrates a particular set of coefficients $C_i$ and $G_b$ to produce the family of responses illustrated in FIG. 1. In generating the values for Table III the values of scaling factor $G_b$ were selected to be integral powers of two, thus, the tabulated values of $G_b$ are actually the values $G_b'$.

TABLE III

| Setting db | C1 | C2 | C3 | C4 | C5 | $G_b$ |
|---|---|---|---|---|---|---|
| BASE CONTROL | | | | | | |
| +18 | 0.0000000 | 0.0171650 | 0.0000000 | 0.9955399 | 0.0000000 | 2 |
| +15 | 0.5000000 | 0.0147500 | 0.0000000 | 0.9940000 | 0.0000000 | 2 |
| +12 | 0.5000000 | 0.0121500 | 0.0000000 | 0.9921700 | 0.0000000 | 2 |
| +9 | 0.5000000 | 0.0093400 | 0.0000000 | 0.9899999 | 0.0000000 | 2 |
| +6 | 0.5000000 | 0.0063450 | 0.0000000 | 0.9874899 | 0.0000000 | 2 |
| +3 | 0.5000000 | 0.0032100 | 0.0000000 | 0.9846499 | 0.0000000 | 2 |
| flat | 0.5000000 | 0.0000000 | 0.0000000 | 0.0000000 | 0.0000000 | 2 |
| −3 | 0.5000000 | −.0032100 | 0.0000000 | 0.9782300 | 0.0000000 | 2 |
| −6 | 0.5000000 | −.0063450 | 0.0000000 | 0.9748000 | 0.0000000 | 2 |
| −9 | 0.5000000 | −.0093400 | 0.0000000 | 0.9713200 | 0.0000000 | 2 |
| −12 | 0.5000000 | −.0121500 | 0.0000000 | 0.9678700 | 0.0000000 | 2 |
| −15 | 0.5000000 | −.0147500 | 0.0000000 | 0.9644999 | 0.0000000 | 2 |
| −18 | 0.5000000 | −.0171650 | 0.0000000 | 0.9612099 | 0.0000000 | 2 |
| TREBLE CONTROL | | | | | | |
| +18 | 0.7275000 | −.4173688 | 0.2313852 | 1.0762030 | −.3845240 | 8 |
| +15 | 0.5575000 | −.2465257 | 0.1449992 | 1.2077070 | −.4424910 | 8 |
| +12 | 0.8400000 | −.2742091 | 0.1698182 | 1.3234660 | −.5004147 | 4 |
| +9 | 0.6275000 | −.1415690 | 0.0917483 | 1.4243120 | −.5563668 | 4 |
| +6 | 0.9450000 | −.1308198 | 0.0881146 | 1.5114720 | −.6093363 | 2 |
| +3 | 0.6850000 | −.0438062 | 0.0303945 | 1.5859550 | −.6582076 | 2 |
| flat | 0.5000000 | 0.0000000 | 0.0000000 | 0.0000000 | 0.0000000 | 2 |
| −3 | 0.7299270 | 0.0466793 | −.0323880 | 1.6499060 | −.7025792 | 1 |
| −6 | 0.5291005 | 0.0732453 | −.0493349 | 1.6499060 | −.7025792 | 1 |
| −9 | 0.3984064 | 0.0898779 | −.0582520 | 1.6499060 | −.7025792 | 1 |
| −12 | 0.2976191 | 0.0971546 | −.0601680 | 1.6499060 | −.7025792 | 1 |
| −15 | 0.2242153 | 0.0991477 | −.0583157 | 1.6499060 | −.7025792 | 1 |
| −18 | 0.1718213 | 0.0985744 | −.0546487 | 1.6499060 | −.7025792 | 1 |

What is claimed is:

1. Tone control apparatus for processing sampled data audio signals, comprising:

a signal input terminal for applying said sampled data audio signals;

a cascade connection of alternating combining means and delay elements wherein each delay element is coupled between two combining means, each of said combining means having at least two input terminals and an output terminal, each of said delay elements having an input terminal coupled to the output terminal of the immediately preceding combining means and an output terminal coupled to an input terminal of the immediately succeeding combining means of said cascade connection;

a first plurality of weighting circuits for weighting samples applied thereto by respective coefficient values, each of said weighting circuits having an input terminal coupled to said signal input terminal, having respective coefficient input terminals and having respective output terminals coupled to input terminals of respective combining means;

a second plurality of weighting circuits for weighting samples applied thereto by respective coefficient values, each of said weighting circuits of said second plurality having an input terminal connected at the output terminal of the lastmost delay element of said cascade connection, having respective coefficient input terminals, and having respective output terminals coupled to input terminals of the firstmost and respective intermediate ones of said combining means of said cascade connection;

a further weighting means having an input terminal coupled to the output terminal of the lastmost combining means of said cascade connection, having a coefficient input terminal and having an output terminal at which tone controlled audio signals is available;

coefficient providing means having user input controls, and programmed to provide predetermined sets of coefficient values responsive to user input stimuli; and means for coupling said predetermined sets of coefficient values to the coefficient input terminals of said first and second pluralities and further weighting means.

2. The tone control apparatus set forth in claim 1 wherein said cascade connection consists of two delay elements each of which provides a delay interval equivalent to one sample period of said sampled data audio signal, and three sample combining circuits.

3. The tone control apparatus set forth in claim 1 wherein said coefficient providing means provides coefficients constrained to have magnitude values less than one to said first plurality of sample weighting means and provides coefficients corresponding to values of integral powers of two to said further sample weighting means.

* * * * *